United States Patent
Shaw et al.

(10) Patent No.: US 8,423,238 B2
(45) Date of Patent: Apr. 16, 2013

(54) MONITORING BATTERY HEALTH IN AN HVAC SYSTEM

(75) Inventors: John J. Shaw, Burnsville, MN (US); Ladd J. Brabec, Savage, MN (US); Phillip M. Abbott, St. Paul, MN (US); Matthew A. Musich, Minneapolis, MN (US)

(73) Assignee: Thermo King Corporation, Minneapolis, MN (US)

( * ) Notice: Subject to any disclaimer, the term of this patent is extended or adjusted under 35 U.S.C. 154(b) by 256 days.

(21) Appl. No.: 12/847,292

(22) Filed: Jul. 30, 2010

(65) Prior Publication Data
US 2011/0029193 A1 Feb. 3, 2011

Related U.S. Application Data

(60) Provisional application No. 61/230,377, filed on Jul. 31, 2009.

(51) Int. Cl.
| | |
|---|---|
| G01M 17/00 | (2006.01) |
| G06F 7/00 | (2006.01) |
| G06F 19/00 | (2006.01) |
| G06F 17/00 | (2006.01) |
| B60L 9/00 | (2006.01) |
| B60L 11/00 | (2006.01) |
| G05D 1/00 | (2006.01) |
| G05D 3/00 | (2006.01) |
| H02J 7/00 | (2006.01) |
| H02J 7/04 | (2006.01) |
| H02J 7/16 | (2006.01) |
| G01R 31/36 | (2006.01) |
| G08B 17/10 | (2006.01) |

(52) U.S. Cl.
USPC ......... 701/33.4; 701/22; 702/63; 340/636.12; 340/636.18; 340/636.19; 320/132; 320/136; 320/149

(58) Field of Classification Search ............ 379/102.05; 700/276–306; 320/132–136, 109, 149; 701/36, 701/120, 22, 33.4; 340/636.1–636.21; 324/426; 180/65.1–65.8; 702/63
See application file for complete search history.

(56) References Cited

U.S. PATENT DOCUMENTS

| 5,321,626 A | 6/1994 | Palladino |
| 5,321,627 A | 6/1994 | Reher |

(Continued)

FOREIGN PATENT DOCUMENTS

| JP | 2002325362 | 11/2002 |
| WO | 2011/014758 | 2/2011 |

OTHER PUBLICATIONS

International Search Report for application No. PCT/US2010/043884, dated Sep. 22, 2011 (4 pages).

(Continued)

*Primary Examiner* — Khoi Tran
*Assistant Examiner* — Abby Lin
(74) *Attorney, Agent, or Firm* — Michael Best & Friedrich LLP

(57) ABSTRACT

Systems and methods of monitoring battery health in an HVAC system. The charge state of a rechargeable battery and the number of amp-hours provided to or from the rechargeable battery are monitored. The number of amp-hours provided is recorded and an end-of-life condition is detected based on the number of amp-hours provided during the charge or discharge cycle. In some constructions, the end-of-life condition is detected by comparing the number of amp-hours provided during the charge or discharge cycle to a threshold. In some constructions, the end-of-life condition is detected by calculating a rate of change of the number of amp-hours provided during a charge or discharge cycle and comparing the rate of change to a threshold.

17 Claims, 3 Drawing Sheets

U.S. PATENT DOCUMENTS

| | | | |
|---|---|---|---|
| 5,357,203 A | 10/1994 | Landau et al. | |
| 5,371,682 A | 12/1994 | Levine et al. | |
| 5,444,378 A | 8/1995 | Rogers | |
| 5,561,362 A | 10/1996 | Kawamura et al. | |
| 5,939,855 A | 8/1999 | Proctor et al. | |
| 6,215,312 B1 | 4/2001 | Hoenig et al. | |
| 6,300,763 B1 | 10/2001 | Kwok | |
| 6,331,762 B1 | 12/2001 | Bertness | |
| 6,404,163 B1* | 6/2002 | Kapsokavathis et al. | 320/104 |
| 6,417,668 B1 | 7/2002 | Howard et al. | |
| 6,549,014 B1 | 4/2003 | Kutkut et al. | |
| 6,737,831 B2 | 5/2004 | Champlin | |
| 6,936,995 B2* | 8/2005 | Kapsokavathis et al. | 320/132 |
| 7,078,877 B2 | 7/2006 | Salasoo et al. | |
| 7,119,518 B1 | 10/2006 | Dougherty et al. | |
| 7,129,675 B2 | 10/2006 | Brecht | |
| 7,208,914 B2 | 4/2007 | Klang | |
| 7,421,323 B2* | 9/2008 | Dannenberg et al. | 701/36 |
| 7,449,891 B2 | 11/2008 | Cawthorne | |
| 7,471,090 B2 | 12/2008 | Atehortua et al. | |
| 7,555,364 B2 | 6/2009 | Poth et al. | |
| 7,570,022 B2 | 8/2009 | Zettel et al. | |
| 7,966,099 B2* | 6/2011 | Fima | 700/276 |
| 2004/0189254 A1* | 9/2004 | Kapsokavathis et al. | 320/132 |
| 2005/0127877 A1* | 6/2005 | Tsuchiya et al. | 320/132 |
| 2007/0090803 A1 | 4/2007 | Yun et al. | |
| 2007/0247106 A1* | 10/2007 | Kawahara et al. | 320/104 |
| 2008/0186028 A1 | 8/2008 | Jones et al. | |
| 2009/0009352 A1* | 1/2009 | Savage et al. | 340/663 |
| 2009/0015202 A1 | 1/2009 | Miura | |
| 2009/0017643 A1 | 1/2009 | Oakes | |
| 2009/0139781 A1 | 6/2009 | Straubel | |
| 2009/0229288 A1* | 9/2009 | Alston et al. | 62/236 |
| 2009/0309546 A1 | 12/2009 | Altman | |
| 2010/0036628 A1* | 2/2010 | Plestid | 702/63 |
| 2010/0250162 A1* | 9/2010 | White et al. | 702/63 |
| 2011/0025124 A1 | 2/2011 | Brabec | |
| 2011/0025125 A1 | 2/2011 | Brabec | |

OTHER PUBLICATIONS

Written Opinion for application No. PCT/US2010/043884, dated Sep. 22, 2011 (4 pages).

* cited by examiner

MONITORING BATTERY HEALTH IN AN HVAC SYSTEM

RELATED APPLICATIONS

The present patent application claims the benefit of U.S. Provisional Patent Application No. 61/230,377 filed Jul. 31, 2009, the entire content of which is herein incorporated by reference.

FIELD OF THE INVENTION

The invention relates to a system and method for monitoring battery health. In particular, the system monitors and tracks battery characteristics in mobile systems such as heating, ventilation, and air conditioning (HVAC) systems in over-the-road or off-road tractors.

BACKGROUND

Some class 6, 7, or 8 over-the-road or off-road tractors on the market today include a primary or auxiliary HVAC system for cooling or heating the vehicle. These systems generally receive power from one or more sources, including external shore power or auxiliary power units, the vehicle alternator, and one or more rechargeable batteries.

SUMMARY

The ability of a rechargeable battery to carry a charge decreases over the useful life of the battery. As such, the amount of amp-hours available from the fully-charged battery will decrease toward the end of the life of the battery.

In one embodiment, the invention provides a control system for an HVAC system. The control system includes a processor and a computer readable memory storing instructions. The control system monitors a charge state of a battery and the number of amp-hours provided to the battery or from the battery during a charge or discharge cycle, respectively. The control system detects when the battery is in a first charge state and a second charge state and records the number of amp-hours provided during a charge cycle or a discharge cycle. A discharge cycle includes depleting the battery from the first charge state to the second charge state without any intervening charging of the battery. A charge cycle includes charging the battery from the second charge state to the first charge state without any intervening usage of the battery. The control system then detects an end-of-life condition of the battery based on the number of amp-hours provided during the charge cycle or discharge cycle.

In some embodiments, the battery is in the first charge state when fully charged and in the second charge state when fully discharged. In some embodiments, the end-of-life condition is detected by comparing the number of amp-hours provided during the charge cycle or discharge cycle to a threshold. In some embodiments, the end-of-life condition is detected by determining a rate of change of the number of amp hours provided during the charge cycle or discharge cycle and comparing the rate of change to a threshold.

In another embodiment, the invention provides a vehicle that includes an HVAC system, an alternator, a rechargeable battery, and the control system described above.

In yet another embodiment, the invention provides a method of monitoring battery health in an HVAC system. The charge state of the battery and the number of amp-hours provided to or from the battery during a charge or discharge cycle, respectively, are monitored. The method includes detecting when the battery is in a first charge state and a second charge state and recording the number of amp-hours provided to or from the battery during a charge or discharge cycle, respectively. A discharge cycle includes depleting the battery from the first charge state to the second charge state without any intervening charging of the battery. A charge cycle includes charging the battery from the second charge state to the first charge state without any intervening usage of the battery. The method then includes detecting an end-of-life condition of the battery based on the number of amp-hours provided during the charge cycle or discharge cycle.

In still another embodiment, the invention provides a control system for an HVAC system. The control system monitors a charge state of a battery and the number of amp-hours provided by the battery to the HVAC system. The control system also detects when the battery is in a full-charge state and a full-discharge state and records the number of amp-hours provided by the battery during a complete discharge cycle. The control system detects an end-of-life condition of the battery based on the number of amp-hours provided by the battery during the complete discharge cycle.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
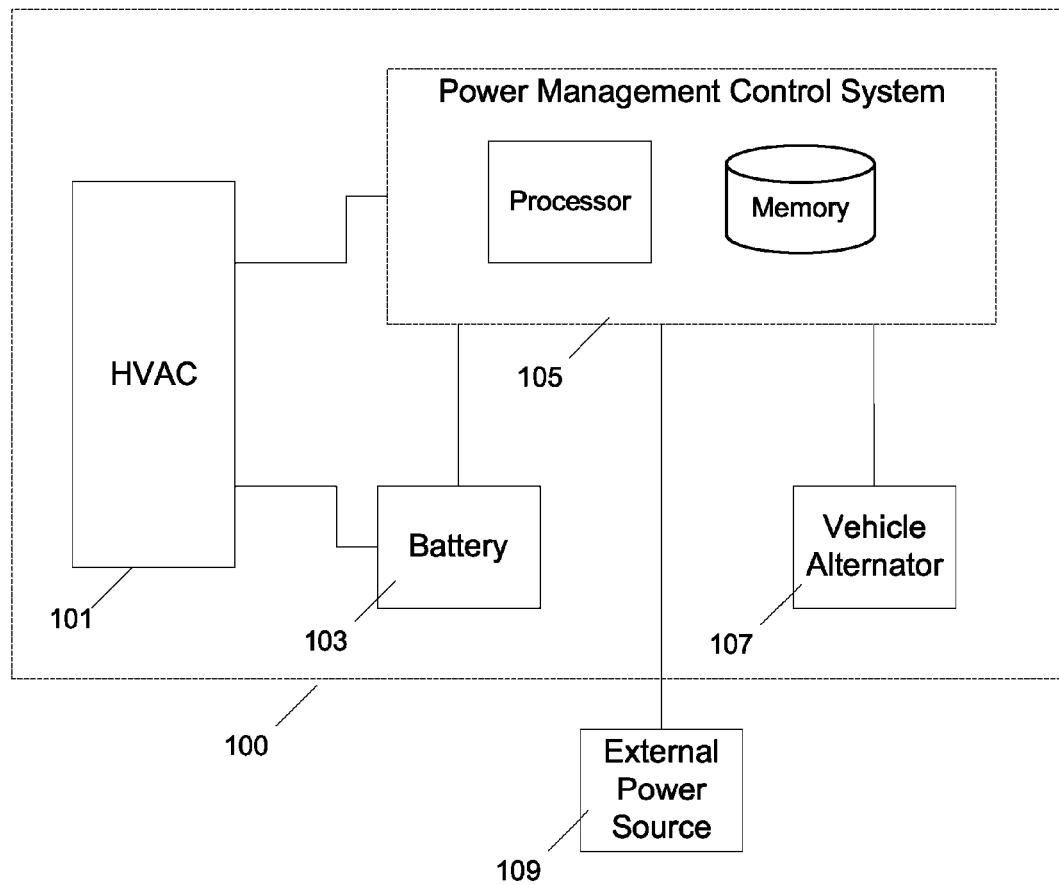
FIG. 1 is a block diagram of a vehicle including a HVAC system, a power management control system, and a battery according to one embodiment of the invention.

FIG. 1 illustrates the arrangement of an HVAC system in an over-the-road tractor vehicle 100 according to one embodiment of the invention. An exemplary vehicle 100 is described in the patent application entitled, "Bi-Directional Battery Voltage Converter," U.S. Provisional Application No. 61/230,296 (filed Jul. 31, 2009), the subject matter of which was also included in U.S. Provisional Application No. 61/230,377 (filed Jul. 31, 2009), both of which are incorporated herein by reference.

The HVAC system 101 is connected to the battery 103, which provides electrical power to operate the HVAC system 101. The battery 103 is also connected to a power management control system 105, which monitors the condition of the battery 103 during charging and discharging. In various constructions, the power management control system 105 can be implemented in different ways and can serve different functions. In the example illustrated in FIG. 1, the power management control system 105 is a separate component that includes a processor that is capable of executing computer instructions and a computer readable memory that stores computer instructions and other information collected and calculated by the processor. However, in other constructions, the power management control system 105 includes an ASIC or other circuit designed to provide the functionality described below. Furthermore, in this example, the power management control system 105 controls the charging of the battery 103 and regulates the power provided to other electrical components within the vehicle 100. However, in other implementations, the power management control system 105 is incorporated as part of the HVAC system 101 or is a separate control system that is dedicated to controlling power only for the HVAC system 101. Similarly, in the shown example, the battery 103 only provides electrical power to the HVAC system 101. However, in other implementations, the battery 103 powers a subset of electrical components including the HVAC system 101 and other electrical components of the vehicle 100.

The power management control system 105 in the shown example also monitors and controls the process of charging the battery 103. Power is provided to charge the battery from a source, such as the alternator 107, of the vehicle 100 or from an external source 109 (e.g., shore power, external auxiliary power unit, etc.). In this example, the power management control system 105 provides a three-stage controlled charge to the battery 103. The three-stages include bulk, absorption, and float. In the bulk stage, the power management control system 105 provides electrical power from either the alternator 107 or the external source 109 to the battery 103 at a constant voltage or a constant current. During the absorption stage, the power management control system 105 provides electrical power to the battery 103 while also reducing heat generated by the battery 103. In the float stage, the power management control system 105 maintains the charge on the battery 103 without overcharging. Although the example illustrated in FIG. 1 and described below includes a three-stage controlled charge algorithm, the methods and descriptions described herein can be modified to include other control algorithms (e.g., a four-stage control algorithm). Furthermore, other embodiments of the invention may include no charging algorithm. In such embodiments, the alternator 107 or the external power source 109 is connected directly to the battery 103 and continues to provide the same charge at all times. In such implementations, the power management control system 105 monitors the charging and discharging processes without managing or controlling either process.

In additional to controlling the charging process of the battery 103 as described above, the power management control system 105 also determines and monitors various battery parameters during charging and discharging. These parameters include, but are not limited to, the battery voltage, the battery charge and discharge amperage, the battery type, battery temperature, humidity, the stage of charge (e.g., bulk, absorption, or float), and the amount of time that the system is in each charging state. The power management control system 105, in some constructions, stores one or more of these parameters over time to monitor the rate of change or to provide historical battery data for other purposes.

The power management control system 105 also monitors the amount of energy discharged from the battery. The power management control system 105 determines the number of amp-hours provided by the battery to the HVAC system 101 between charges. The power management control system 105 stores these values so that, as described below, the power management control system 105 can monitor the total amount of energy that can be provided by the battery and how that amount changes over the life of the battery.

In one embodiment of the invention, the power management control system 105 provides power to the HVAC system 101 directly from the vehicle alternator 107 when the engine (not pictured) of the vehicle 100 is running. Similarly, the power management control system 105 provides power to the HVAC system 101 from the external power source 109 when the vehicle is connected to such an external source 109. Furthermore, when the vehicle's engine is running or when the vehicle 100 is connected to an external power source 109, the power management control system 105 charges the battery 103 according to the three-stage charging algorithm.

When the engine is not running and the vehicle 100 is not connected to an external power source, the HVAC system 101 is powered by the battery 103. In other constructions, the HVAC system 101 is powered directly from the battery 103 regardless of whether the engine is running or if an external power source 109 is connected.

Figure 2A:
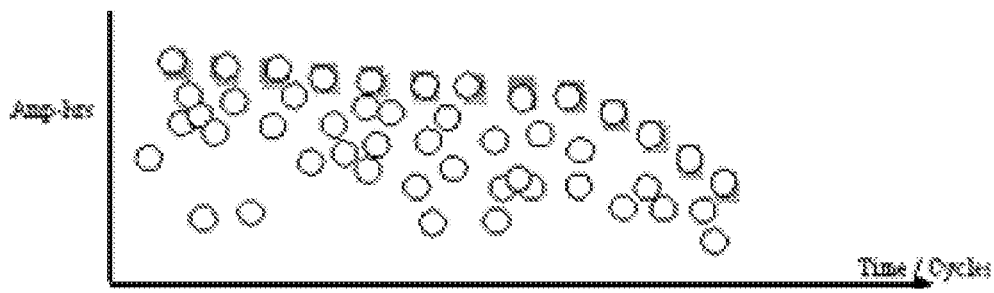
FIG. 2A is a graph showing the total available amp-hours on a battery after each charging cycle over time.

Because the battery charging process is stopped when the vehicle engine stops and when the vehicle is disconnected from the external power source 109, the battery 103 does not always receive a full charge during the charging process. Similarly, the battery begins charging when the vehicle engine is started or when the vehicle is connected to an external power source 109. As such, the battery 103 is not always fully discharged when the charging process begins. An example of this is illustrated in FIG. 2A. FIG. 2A shows the total charge on the battery 103 in available amp-hours over time (or over charging cycles). The circular notations indicate the charge in available amp-hours on the battery 103 when the charging process ends (e.g., when the vehicle engine is stopped or when the external power source 109 is disconnected).

Figure 2B:
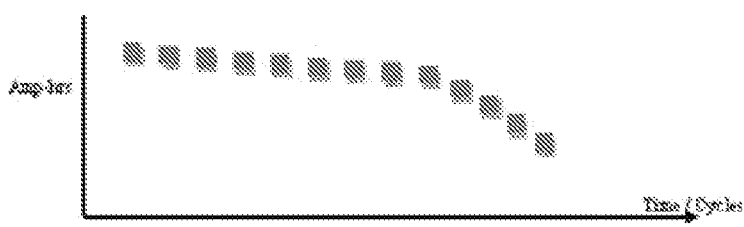
FIG. 2B is a graph showing the total available amp-hours provided by a battery during complete discharge cycles over time.

The battery health monitoring process described herein in one implementation relies, at least in part, on calculating the total number of amp-hours provided by a fully charged battery 103 to the HVAC system 101. As such, the power management control system 105 applies a filter to the acquired data to distinguish between a fully charged battery and a partially charged battery. In FIG. 2A, the cycles in which the battery 103 is fully charged and the amount of charge available on the fully charged battery in amp-hours are indicated by the square notation on the graph. FIG. 2B shows the fully charged cycles after the partially charged cycles have been filtered out.

One mechanism for distinguishing between a fully charged battery and a partially charged battery is by monitoring the charge stage. When the system enters the float stage, the battery 103 is fully charged and the power management system 105 maintains the charge without overcharging. Because the depth of discharge of a battery does not generally change over the useful life of the battery, the power management control system 105 is able to distinguish between a partially discharged battery and a fully discharged battery by monitoring the voltage of the battery and detecting when the voltage falls below a threshold. In some implementations, other algorithms or filtering techniques are used to distinguish between a fully discharged battery and a partially discharged battery. Similarly, other algorithms or filtering techniques are used in some systems to distinguish between a fully charged battery and a partially charged battery.

Although the examples described herein refer to a "fully discharged" battery, it is often preferable to not completely discharge a rechargeable battery. As such, in some embodiments, batteries will be considered to be fully discharged when the current charge on the battery is at or below a defined threshold. For example, in some embodiments, a battery is "fully discharged" when the remaining charge is below 20% of the original full charge capacity of the battery.

Figure 3:
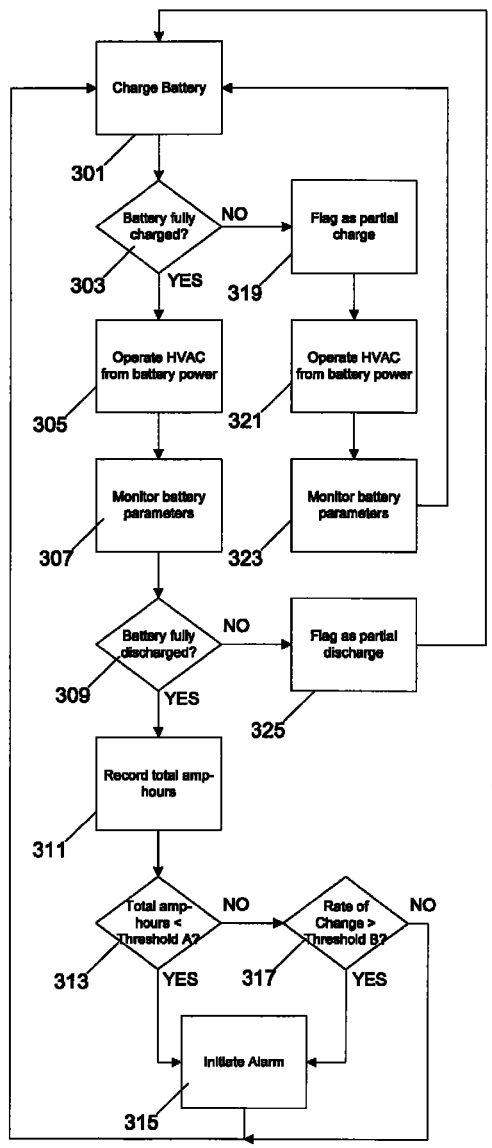
FIG. 3 is a flowchart showing a method of monitoring battery health.

As indicated in FIG. 2B, the available amp-hours provided by a fully charged battery decreases over time and over charging cycles. Eventually, the battery is no longer able to hold a useful charge and needs to be replaced. FIG. 3 illustrates a method for monitoring battery health and for indicating when the battery 103 needs to be replaced.

The power management control system 105 begins by applying a charge to the battery according to a three-stage algorithm (step 301). After the charging cycle is complete (e.g., when the vehicle engine is turned off or when the vehicle 100 is disconnected from an external power source 109), the power management control system determines whether the battery 103 is fully charged (step 303). If the battery 103 is fully charged, the power management control system begins to operate the HVAC system 101 using power from the battery 103 (step 305). While operating the HVAC system 101, the power management control system 105 monitors battery parameters and stores one or more parameters in its memory (step 307). When the discharge cycle is completed (e.g., when the vehicle engine is turned on or when the vehicle 100 is connected to an external power source 109), the power management control system 105 determines whether the battery 103 is fully discharged (step 309). If so, the power management control system 105 determines the total amp-hours provided by the fully charged battery during the discharge system and stores that value to the memory (step 311).

If, however, the power management control system 105 determines that the charging cycle was terminated before the battery was fully charged (step 303), the current discharge cycle is flagged as a partial charge (step 319). The power management control system 105 continues to operate the HVAC from battery power (step 321) and to monitor battery parameters (step 323). However, when the discharge cycle ends, the power management control system does not record the total amp-hours to the same location as those stored in step 311. In some implementations, the power management control system 105 monitors and records the total amp-hours provided by a partially charged battery; however, those values are filtered out and are not included in the same battery health monitoring analysis described herein. Similarly, if the power management control system 105 determines that the discharge cycle was terminated before the battery was fully discharged (step 309), the power management control system 105 filters the amp-hours discharged during that discharge cycle from the battery health monitoring analysis.

Figure 4:
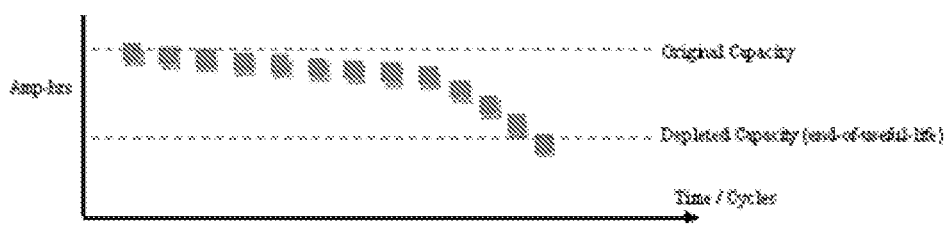
FIG. 4 is a graph showing the decrease of battery capacity over time and showing a threshold that indicates when the battery has reached the end of its useful life.

As the power management control system 105 monitors the total number of amp-hours provided by the fully charged battery during successive charge/discharge cycles, the power management control system 105 provides one or more checks on battery health based on the recorded information. First, the total number of amp-hours provided by the fully charged battery is compared to a first threshold ("Threshold A") (step 313). As illustrated in FIG. 4 and as described above, the total amp-hour capacity of a fully charged battery decreases from its original capacity over time. Eventually, the total number of amp-hours falls below a depleted capacity threshold. The power management control system 105 detects this condition and initiates an alarm notifying the vehicle operator that the battery has reached or is approaching the end of its useful life and needs to be replaced (step 315). This alarm can be displayed to the user on the dashboard of the vehicle 100 or can be reported to another remote location, such as a service center or a vehicle headquarters.

Figure 5:
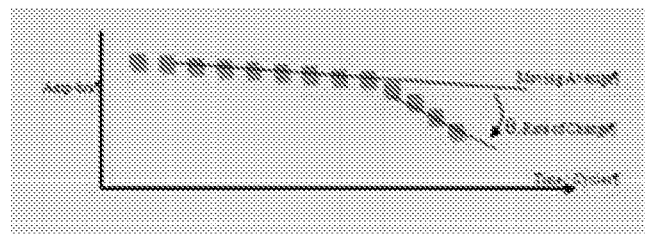
FIG. 5 is a graph showing the rate of change of battery capacity over time.

Another test that is performed by the power management control system 105 in this example is based on the rate of change of the capacity of a fully charged battery. As illustrated in FIG. 5, the capacity of many batteries decreases gradually over the course of time and the average capacity generally maintains a fairly constant rate of change. However, toward the end of the useful life of the battery, the rate of change increases. As such, the power management control system 105 records the total capacity of the battery over time and monitors the average capacity and the rate of change. When the rate of change exceeds a threshold ("Threshold B") (step 317), the power management control system 105 initiates an alarm (step 315).

The second alarm can be the same as the first alarm as illustrated in FIG. 3 or it can be a different alarm. For example, in some batteries, the rate of change of battery capacity begins to change while the battery still has a significant amount of useful life remaining In some constructions, the "rate of change" alarm provides a preliminary warning that the battery approaches the end of its useful life and the "capacity threshold" alarm indicates that the battery has reached the end of its useful life. Furthermore, as noted above, the power management control system 105 determines the type of battery connected to the system. As such, the power management control system 105, in some implementations, selects the thresholds and the type of alarms and health monitoring algorithms based on the type of battery that has been connected to the system.

It is noted that, although the description above refers to an "increasing" rate of change, the slope of the rate of change in FIG. 5 is actually becoming more negative. As such, the phrase "increasing rate of change" refers to an increase in the absolute value of the rate of change. Furthermore, although the example above monitors and tracks the total amp-hours provided during the discharge phase, the power management control system 105, in some constructions, monitors the amp-hours provided to the battery during the charging phase. Similarly, in some constructions, the power management control system 105 monitors both the total amp-hours provided to the battery in the charging phase and the total amp-hours provided by the battery in the discharge phase.

Although the examples described above are discussed in the context of an electrically powered HVAC system in an over-the-road tractor vehicle, the same battery health monitoring systems and method could be applied to batteries in other types of vehicles such as an off-road tractor or a passenger vehicle. Furthermore, the battery monitoring systems and methods could also be applied to batteries that are used to power other devices.

Thus, the invention provides, among other things, a new and useful system for monitoring the health of a battery in a vehicle by filtering out battery data acquired in cycles when the battery is not fully charged or fully discharged. The system also includes an alarm that indicates when the battery is approaching or has reached the end of its useful life. Various features and advantages of the invention are set forth in the following claims.

The invention claimed is:

1. A control system for an HVAC system, the control system comprising a processor and a computer readable memory storing instructions that, when executed by the processor, cause the control system to:

monitor a charge state of a battery;

monitor a number of amp-hours provided to the battery during charging;

detect when the battery is in a first charge state;
detect when the battery is in a second charge state;
record a number of amp-hours provided during each of a plurality of charge cycles, a charge cycle including charging the battery from the second charge state to the first charge state without any intervening usage of the battery; and
detect an end-of-life condition of the battery by calculating a rate of change of the number of amp-hours provided over each of the plurality of charge cycles and comparing the rate of change to a threshold rate of change.

2. The control system of claim 1, wherein the instructions, when executed by the processor, cause the control system to detect the end-of-life condition by comparing the number of amp-hours provided by the battery during one of the plurality of charge cycles to a charge capacity threshold.

3. The control system of claim 1, wherein the instructions, when executed by the processor, further cause the control system to record a number of amp-hours provided by the battery during each of a plurality of discharge cycles, a discharge cycle including depleting the battery from the first charge state to the second charge state without any intervening charging of the battery, and cause the control system to detect the end-of-life condition by
  calculating a discharge capacity rate of change, the discharge capacity rate of change including the number of amp-hours provided by the battery over each of the plurality of discharge cycles; and
  comparing the discharge capacity rate of change to a discharge capacity rate of change threshold.

4. The control system of claim 1, wherein the instructions, when executed by the processor, further cause the control system to
  record a total number of amp-hours provided by the battery;
  record a number of full and partial discharge cycles provided by the battery; and
  monitor battery voltage.

5. The control system of claim 1, wherein the battery is fully charged when in the first charge state and is storing less than 20% of a full charge when in the second charge state.

6. The control system of claim 1, wherein the instructions, when executed by the processor, further cause the control system to
  detect whether the control system is connected to an external power source; and
  charge the battery and provide power to the HVAC system from the external power source when the control system is connected to the external power source.

7. A vehicle comprising the control system of claim 1, an HVAC system, an alternator, and a rechargeable battery all coupled to the control system.

8. The vehicle of claim 7, wherein the instructions, when executed by the processor, further cause the control system to determine whether the vehicle is running and to charge the battery and provide power to the HVAC system from a vehicle alternator when the vehicle is running.

9. A method of monitoring battery health in an HVAC system comprising:
  monitoring, by a controller, a charge state of a battery;
  monitoring, by the controller, a number of amp-hours provided by the battery during usage;
  detecting, by the controller, when the battery is at a first charge state;
  detecting, by the controller, when the battery is at a second charge state;
  recording, to a memory, a number of amp-hours provided during each of a plurality of discharge cycles, each discharge cycle including depleting the battery from the first charge state to the second charge state without any intervening charging of the battery; and
  detecting, by the controller, an end-of-life condition of the battery by calculating a rate of change of the number of amp-hours provided over each of the plurality of discharge cycles and comparing the rate of change to a threshold rate of change.

10. The method of claim 9, further comprising detecting an end-of-life condition of the battery by comparing the number of amp-hours provided by the battery during one of the plurality of discharge cycles to a battery capacity threshold.

11. The method of claim 9, further comprising recording a number of amp-hours provided to the battery during each of a plurality of charge cycles, a charge cycle including charging the battery from the second charge state to the first charge state without any intervening usage of the battery, and detecting an end-of-life condition of the battery by
  calculating a charge capacity rate of change, the charge capacity rate of change including the number of amp-hours provided to the battery over each of the plurality of charge cycles; and
  comparing the charge capacity rate of change to a charge capacity rate of change threshold.

12. The method of claim 9, wherein the battery is fully charged when at the first charge state and is holding less than 20% of a full charge when in the second charge state.

13. The method of claim 9, wherein the HVAC system is installed in a vehicle, and further comprising:
  detecting whether the control system is connected to an external power source;
  charging the battery from the external power source when the control system is connected to the external power source; and
  powering the HVAC system from the external power source when the vehicle is connected to the external power source.

14. The method of claim 9, wherein the HVAC system is installed in a vehicle, and further comprising:
  determining whether the vehicle is running;
  charging the battery from a vehicle alternator when the vehicle is running; and
  powering the HVAC system from the vehicle alternator when the vehicle is running.

15. A control system for an HVAC system, the control system comprising a processor and a computer readable memory storing instructions that, when executed by the processor, cause the control system to:
  monitor a charge state of a battery;
  monitor a number of amp-hours provided by the battery to the HVAC system;
  detect when the battery is in a full-charge state;
  detect when the battery is in a full-discharge state;
  record a number of amp-hours provided by the battery during each of a plurality of complete discharge cycles, wherein the complete discharge cycle includes depleting the battery from the full-charge state to the full-discharge state without any intervening charging of the battery;
  calculate a rate of change of the number of amp-hours provided by the battery over the plurality of complete discharge cycles;
  compare the rate of change to a threshold; and detect an end-of-life condition of the battery when the rate of change of the number of amp-hours provided by the battery is greater than the threshold.

16. The control system of claim 15, wherein the battery is in the full-discharge state when the remaining charge is less than 20% of a full charge.

17. A vehicle comprising:
an HVAC system;
an alternator;
a rechargeable battery; and
the control system of claim 15, wherein the instructions, when executed by the processor, further cause the control system to
detect when the vehicle is running,
charge the battery from electricity provided by the alternator when the vehicle is running,
power the HVAC system with electricity provided by the rechargeable battery when the vehicle is not running, and
detect the end-of-life condition of the battery by identifying at least one complete discharge cycle where the number of amp-hours provided by the battery during the at least one complete discharge cycle is less than a battery capacity threshold.

* * * * *